United States Patent [19]
Kodashiro

[11] Patent Number: 5,831,997
[45] Date of Patent: Nov. 3, 1998

[54] PATTERN GENERATING APPARATUS

[75] Inventor: Yoshiaki Kodashiro, Yokohama, Japan

[73] Assignee: Kabushiki Kaisha Toshiba, Kawasaki, Japan

[21] Appl. No.: 826,048

[22] Filed: Mar. 28, 1997

[30] Foreign Application Priority Data

Mar. 29, 1996 [JP] Japan .................................. 8-076435

[51] Int. Cl.$^6$ .............................................. G01R 31/28
[52] U.S. Cl. ..................................... 371/27.1; 395/421.07
[58] Field of Search ................................ 371/27.1, 27.2,
371/22.1, 21.1; 365/201; 395/183.06, 421.08,
412, 416, 417–419, 421.07; 364/580, 717,
717.5

[56] References Cited

U.S. PATENT DOCUMENTS

| | | | |
|---|---|---|---|
| 5,127,010 | 6/1992 | Satoh ........................................ | 371/27 |
| 5,337,045 | 8/1994 | Shirasaka ............................ | 340/825.52 |
| 5,421,026 | 5/1995 | Sato et al. ................................ | 395/800 |
| 5,432,797 | 7/1995 | Takano ...................................... | 371/27 |
| 5,477,494 | 12/1995 | Miyagawa et al. ...................... | 365/201 |
| 5,615,218 | 3/1997 | Tsurumi .................................... | 371/27 |
| 5,651,123 | 7/1997 | Nakagawa et al. ...................... | 395/384 |

Primary Examiner—Robert W. Beausoliel, Jr.
Assistant Examiner—Nadeem Iqbal
Attorney, Agent, or Firm—Foley & Lardner

[57] ABSTRACT

In the pattern generating apparatus, various instruction codes can be generalized, so that various test patterns of different formats prepared for various testers (semiconductor test apparatus) of different models can be used in common. The pattern generating apparatus comprises: an address pointer (2) for applying a memory address (3) to an instruction memory (1); a plurality of decoders (41, 42) selected by two decode enable signals (22, 23) for generating instruction elements (5) on the basis of the instruction code (1-m) outputted by the instruction memory (1); an address generating section (6) for generating a branch destination address (7) on the basis of the instruction elements (65) outputted by the decoder (41 or 42) and for setting the generated branch destination address (7) to the address pointer (2). One of the decoders (41, 42) is selected on the basis of the decode enable signals (22, 23), and the selected decoder generates the instruction elements (5) of plural tester models. On the basis of the generated instruction elements (5), the address generating section (6) outputs the branch destination address (7) to activate the instruction memory (1) via the address pointer (2). Therefore, two patterns can be generated, separately by corresponding one of the two decoders (41, 42).

5 Claims, 5 Drawing Sheets

PATTERN GENERATING APPARATUS

BACKGROUND OF THE INVENTION

1. Field of the Invention

The present invention relates to a pattern generating apparatus, and more specifically to a circuit construction for generating a test pattern by forming pattern addresses in accordance with pattern instructions, in a semiconductor test apparatus referred to as a tester.

2. Description of the Prior Art

FIG. 3 is a circuit diagram showing a prior art test pattern generating apparatus. In FIG. 3, instruction codes 1 to 1-n for controlling pattern addresses are stored in an instruction memory 1, and the stored instruction codes are outputted on the basis of memory addresses 3 outputted by an address pointer 2. The instruction codes outputted from the instruction memory 1 are decoded by a decoder 4 and further classified into instruction elements 5.

As the instruction elements 5, there are an address increment instruction, a register store instruction, a jump instruction, an index instruction, a sub-routine instruction, a sub-routine return instruction, a match instruction, a pattern stop instruction, etc. Therefore, various instructions can be formed on the basis of combinations of these instruction elements 5.

The classified instruction elements 5 are inputted to an address generating section 6. The address generating section 6 generates a branch destination address 7 in accordance with a plurality of instruction elements 5. The branch destination address 7 is inputted to an address pointer 2, and then loaded to the address pointer 2 in accordance with a pointer load instruction 8 transmitted from the address generating section 6 separately. Further, a system clock 9 is given to the address pointer 2 to activate the address pointer 2 in synchronism with this system clock 9.

The memory address 3 outputted by the address pointer 2 is given to the instruction memory 1. At the same time, this memory address 3 is used as an address for accessing one of pattern memories 10 in which various pattern data are stored.

These elements (address pointer 2, instruction memory 1, decoder 4, address generating section 6 and pattern memories 10 etc.) are well known to a person skilled in the art, so they are not explained precisely here.

In the prior art pattern generating apparatus as described above, although addresses can be generated at random by repeating the above-mentioned operation, the pattern generating apparatus involves the following problems:

First, since the used instructions are determined independently for each maker of the testers or each model of the testers, the instruction codes can be decoded in accordance with only a predetermined instruction format; that is, the instruction codes can be decoded in accordance with only a test pattern used only for the tester model.

In the test environment of the actual semiconductor devices, however, it is necessary to conduct the same test by use of a plurality of different tester models in order to increase the availability factor of the test work. In this case, since the same test pattern must be transferred between the testers, when the testers of various models are used, the work for converting the instruction formats is previously required. Further, even after the instruction formats have been converted, the format conversion work is further necessary whenever the test pattern is debugged.

The format conversion work as described above is about one-day work including several hours of computer calculations and other preparatory works. Further, in the case of debugging, since the debugging work is repeatedly executed, the time and labor required for the format conversion work and the debugging work cannot be disregarded and neglected.

On the other hand, there exists a method of converting formats whenever a test pattern is transferred from a tester controller to the instruction memory. In this method, however, since the format conversion must be always executed, there arises another problem in that the test time increases. Further, when there exist a plurality of test patterns, another problem arises in that the management of the test patterns is very complicated.

SUMMARY OF THE INVENTION

With these problems in mind, therefor it is the object of the present invention to provide a pattern generating apparatus, by which various instruction codes can be generalized in such a way that various test patterns of different formats prepared for various testers (semiconductor test apparatus) of different models can be used in common.

To achieve the above-mentioned object, the present invention provides a pattern generating apparatus for generating a test pattern by accessing a pattern memory, which comprises: an address pointer for outputting a memory address composed of an instruction memory address and a pattern memory address for accessing the pattern memory; an instruction memory for storing instructions and for outputting an instruction code according to the instruction memory address; a plurality of decoders each having a different instruction format, for decoding the instruction code outputted by said instruction memory to output one or a plurality of instruction elements; selecting means for selecting any one of said decoders according to a tester model using the test pattern, to output one or plural instruction elements from said selected decoder; and an address generating section responsive to one or plural instruction elements, for outputting a branch destination address corresponding to the received instruction element to said address pointer, said address pointer outputting the memory address on the basis of the outputted branch destination address.

Further, the present invention provides a pattern generating apparatus for generating a test pattern by accessing a pattern memory, which comprises: an address pointer for outputting a memory address composed of an instruction memory address and a pattern memory address for accessing the pattern memory; an instruction memory for storing instructions and for outputting an instruction code according to the instruction memory address; a plurality of conversion data tables each for outputting different conversion data; a selector for selecting one of said conversion data tables, to output the conversion data of said selected conversion data table; a decoder for decoding the instruction code applied by said instruction memory on the basis of the conversion data applied by said selector, to output one or plural instruction elements; and an address generating section responsive to one or plural instruction elements, for outputting a branch destination address corresponding to the received instruction element to said address pointer, said address pointer outputting the memory address on the basis of the outputted branch destination address.

Further, the present invention provides a pattern generating apparatus for generating a test pattern by accessing a pattern memory, which comprises: an address pointer for outputting a memory address composed of an instruction memory address and a pattern memory address for accessing the pattern memory; an instruction memory for storing instructions and for outputting an instruction code according to the instruction memory address; a conversion data table for outputting conversion data; a control circuit for receiving the conversion data outputted by said conversion data table; a decoder for decoding the instruction code applied by said instruction memory on the basis of the conversion data applied by said control circuit, to output one or plural instruction elements; and an address generating section responsive to one or plural instruction elements, for outputting a branch destination address corresponding to the received instruction element to said address pointer, said address pointer outputting the memory address on the basis of the outputted branch destination address.

In the first aspect of the pattern generating apparatus according to the present invention, the decoder is selected by the selecting means to generate instruction elements of plural sorts. On the basis of the generated instruction elements, the address generating section outputs a branch destination address to activate the instruction memory via the address pointer. Therefore, it is possible to generate a plurality of patterns according to the selected decoder.

Further, in the second aspect of the pattern generating apparatus according to the present invention, the conversion data are selected by the selecting means to output the selected conversion data to the decoder together with the instruction code outputted by the instruction memory. On the basis of both the instruction code and the conversion data, the decoder outputs the instruction elements corresponding thereto. The address generating section outputs a branch destination address to activate the instruction memory via the address pointer. Therefore, it is possible to generate a plurality of patterns according to the selected conversion data table.

DETAILED DESCRIPTION OF THE PREFERRED EMBODIMENTS

Embodiments of the present invention will be described hereinbelow with reference to the attached drawings.

Figure 1:
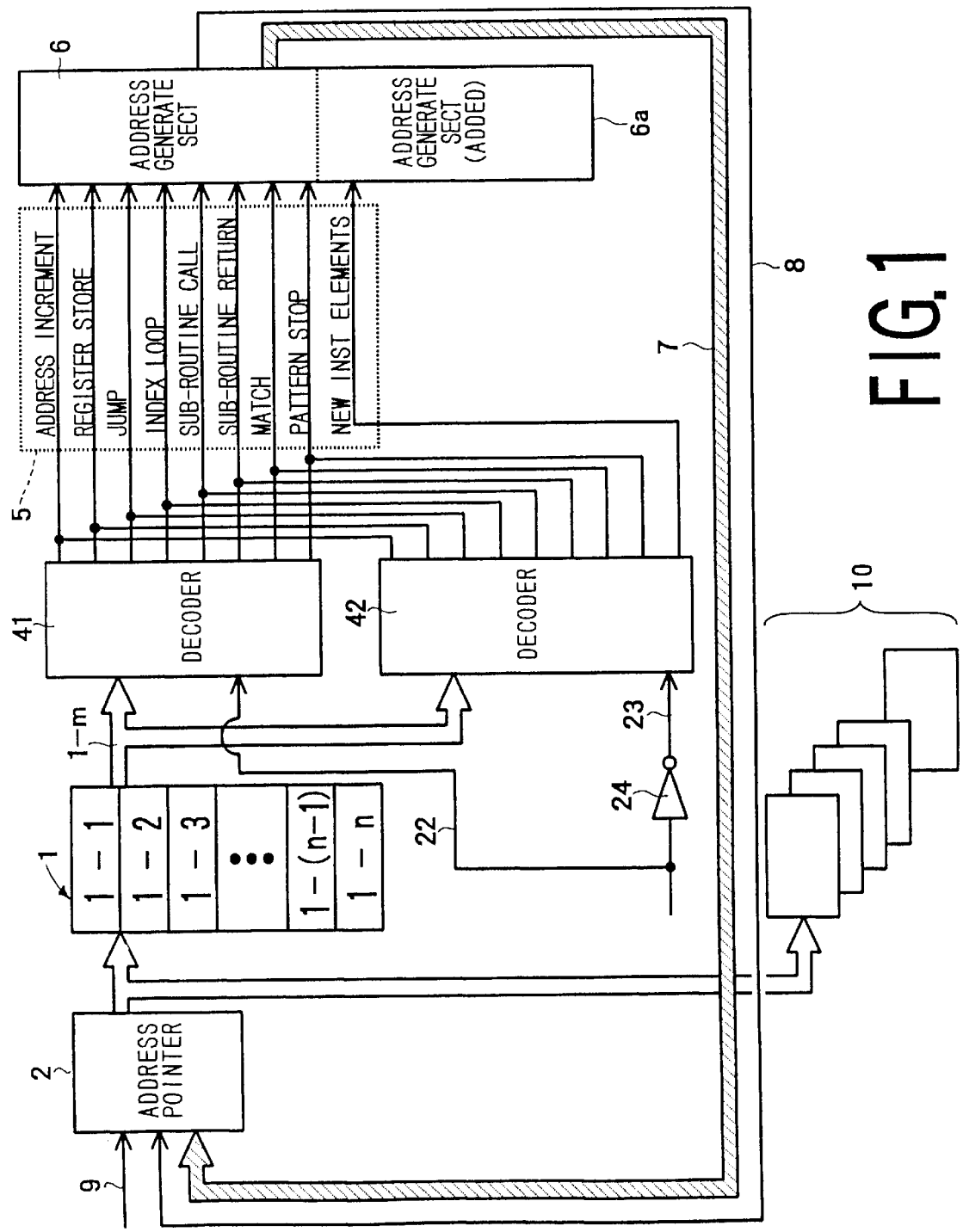
FIG. 1 is a circuit diagram showing a first embodiment of the pattern generating apparatus according to the present invention.

FIG. 1 shows a first embodiment of the pattern generating apparatus according to the present invention. In FIG. 1, the instruction codes 1-1 to 1-n outputted by the instruction code memory 1 are outputted to two decoders 41 and 42 each having different instruction formats, respectively. The two decoders 41 and 42 can classify the instruction codes of different formats into instruction elements 5 separately, so that the patterns of the testers of two different models can be decoded.

Further, the operation of these two decoders 41 and 42 can be decided on the basis of decode enable signals 22 and 23, respectively. Here, since the decode enable signal 23 is inverted by an inverter 24, the two decoders 41 and 42 are never enabled at the same time due to the inversion relationship between the two decode enable signals 22 and 23.

The instruction codes 1-1 to 1-n are stored in the instruction memory 1, and accessed on the basis of the memory address 3 outputted by the address pointer 2. The accessed instruction code 1-m is inputted to the two decoders 41 and 42, respectively.

One of the two decoders 41 and 42 is enabled in response to one of the decode enable signals 22 and 23 to classify the inputted instruction code 1-m into the instruction elements 5. The classified instruction elements 5 are inputted to the address generating section 6. Here, since the outputted instruction elements 5 of each of the two decoders 41 and 42 are OR-connected, even if any one of the decoders 41 and 42 is enabled, the instruction elements 5 processed in the same way can be given to the address generating section 6.

Further, when the instruction codes 1-m cannot be classified on the basis of the common instruction elements, new additional elements are necessary. In this case, since a function for executing additional processing is of course required for the address generating section 6, an additional address generating section 6a is added to the address generating section 6, as shown in FIG. 1.

Address generating section 6 (including 6a), which is well known as described above, comprises a counter, a stack, a selector, several logical operation circuits, several addresses, a system clock and an enable signal etc. The address generating section 6 is designed so that it is functioned as follows. The instruction elements 5 outputted from one of the decoders 4i are applied to the address generating section 6. As a result, the counter in the address generating section 6 outputs a branch destination address 7. This address 7 is applied to the pattern memories 10 via the address pointer 2. The branch address is used in the address generating section 6 execute an operation according to the applied instruction elements.

The operation of the pattern generating apparatus constructed as described above will be described hereinbelow.

First, one of the decoders 41 and 42 is selected on the basis of the decode enable signals 22 and 23 in correspondence to the tester model from which the test pattern is generated.

Then, one of the instruction codes 1-1 to 1-n is outputted from the instruction memory 1 on the basis of a memory address 3 outputted by the address pointer 2. For instance, an instruction code 1-m is inputted to selected one of the decoders 41 and 42. As a result, the instruction elements 5 are outputted from the selected one of the two decoders 41 and 42. In this case, when new instruction elements exist, the instruction elements 5 include these new instruction elements.

The address generating sections 6 and 6a generate a branch destination address 7 according to the inputted instruction elements 5. The generated branch destination address 7 is set to the address pointer 2 on the basis of the pointer load instruction 8 outputted by the address generating sections 6 and 6a simultaneously.

The address pointer 2 generates a memory address 3 in correspondence to the branch destination address 7 in synchronism with the system clock 9.

By repeating the above-mentioned processing, it is possible to generate the addresses of a test pattern.

Figure 1A:
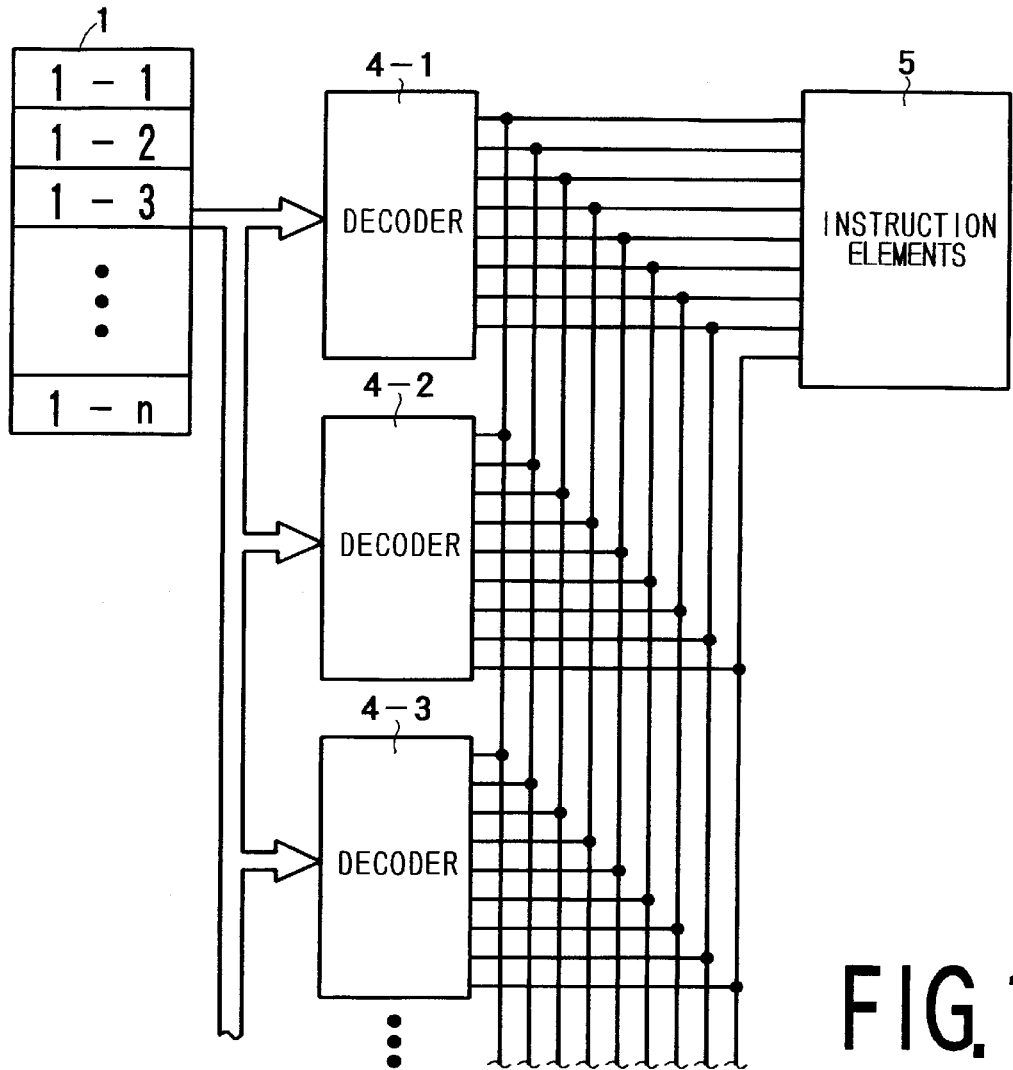
FIG. 1A is a circuit diagram showing a first modification of the first embodiment of the pattern generating apparatus, in which a plurality (three or more) of decoders are provided.

Further, in the first embodiment, although only two decoders 41 and 42 are used, it is of course possible to select one of the three or more decoders according to the number of tester models, as shown in FIG. 1A.

Figure 1B:
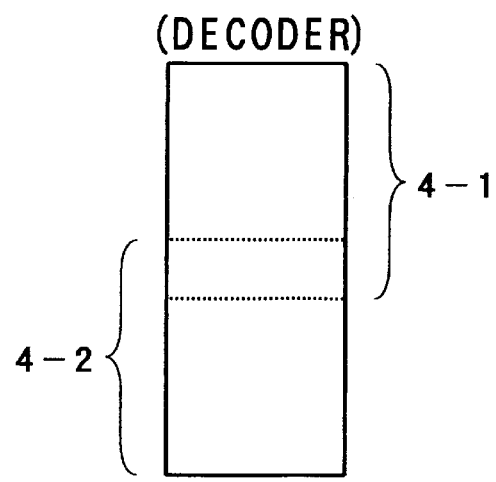
FIG. 1B is a conceptual circuit diagram showing a second modification of the first embodiment of the pattern generating apparatus, in which the elements of a plurality of decoders are used in common from the hardware standpoint, without separating the decoders perfectly.

Further, instead of separating the two decoders 41 and 42 perfectly with respect to the instruction elements 5, it is possible to obtain the similar effect by using some parts of the decoders in common from the hardware stand-point, as shown in FIG. 1B. In this case, the circuit scale can be reduced.

Figure 2:
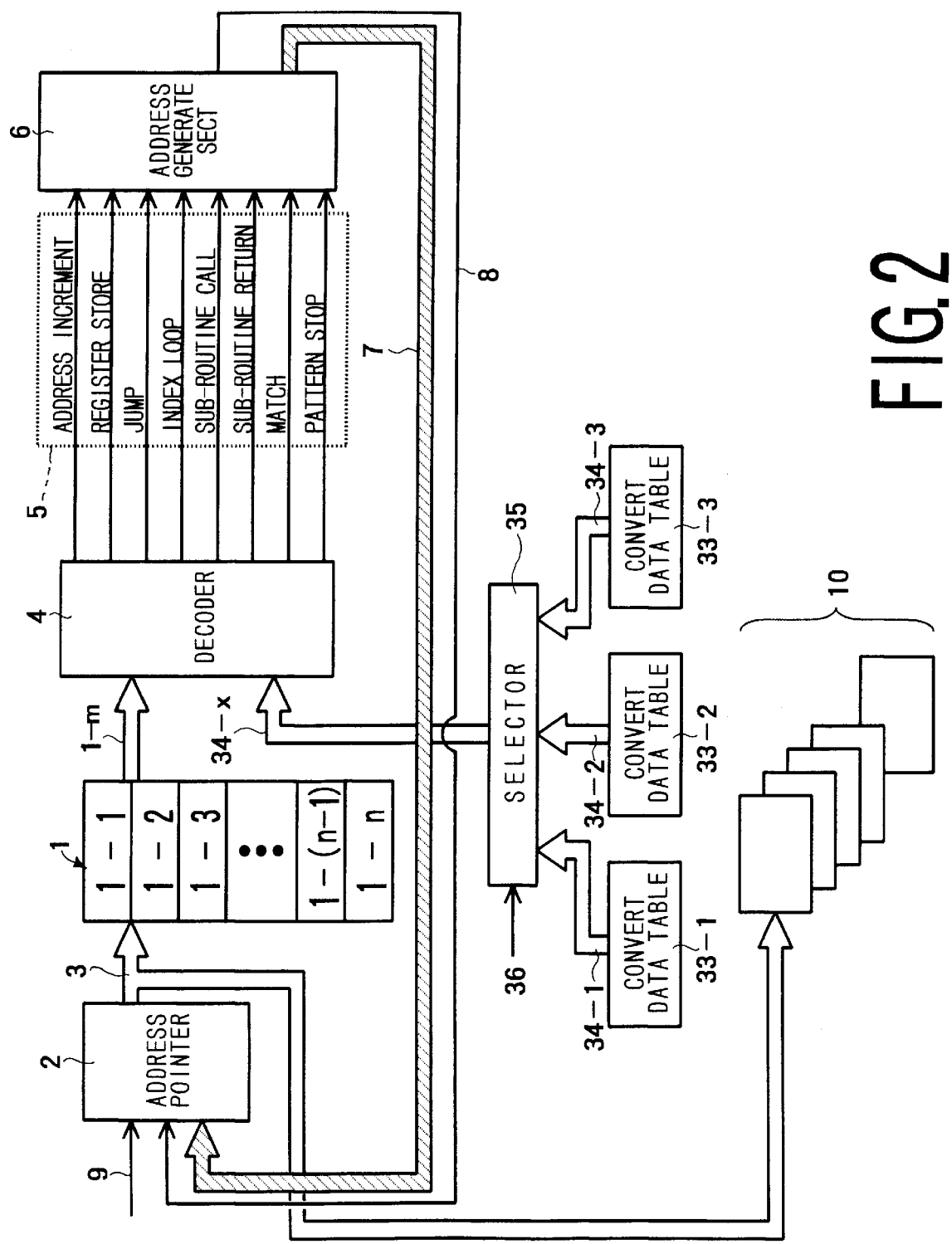
FIG. 2 is a circuit diagram showing a second embodiment of the pattern generating apparatus according to the present invention.

FIG. 2 shows the second embodiment of the pattern generating apparatus according to the present invention. In FIG. 2, in addition to the instruction code 1-m outputted by the instruction memory 1, conversion data 34-x are inputted to the decoder 4 from one of conversion data tables 33-1 to 33-3 selected by a selector 35 on the basis of a select signal 36. Here, conversion data 34-1 to 34-3 for the instruction codes of different formats are stored, respectively in the conversion data tables 33-1 to 33-3. Therefore, any (34-x) of the conversion data are selected by the selector 35 on the basis of the select signal 36, and then given to the decoder 4.

The operation of the pattern generating apparatus constructed as described above will be described hereinbelow.

First, any of the conversion data 34-1 to 34-3 stored in the conversion data tables 33-1 to 33-4 are selected by the selector 35 on the basis of the select signal 36 in correspondence to the tester model from which the test pattern is generated. Then, the selected conversion data 34-x are given to the decoder 4.

On the other hand, the instruction code 1-m is outputted from the instruction memory 1 on the basis of a memory address 3 outputted by the address pointer 2.

As a result, the decoder 4 outputs the instruction elements 5 on the basis of both the instruction code 1-9 stored in the instruction memory 1 and the conversion data 34-x listed in the conversion data tables 33-1 to 33-3.

The address generating section 6 generates a branch destination address 7 according to the inputted instruction elements 5. The generated branch destination address 7 is set to the address pointer 2 on the basis of the pointer load instruction 8 outputted from the address generating section 6, simultaneously.

The address pointer 2 generates the memory address 3 corresponding to the branch destination address 7 in synchronism with the system clock 9.

By repeating the above-mentioned processing, it is possible to generate the addresses of a test pattern.

Further, in the second embodiment, although the three conversion data tables 33-1 to 33-3 are used, it is of course possible to provide four or more conversion data tables and to select one of a plurality of the conversion data tables by the selector 35 according to the number of tester models. In this case, it is of course possible to use two conversion data tables.

Figure 2A:
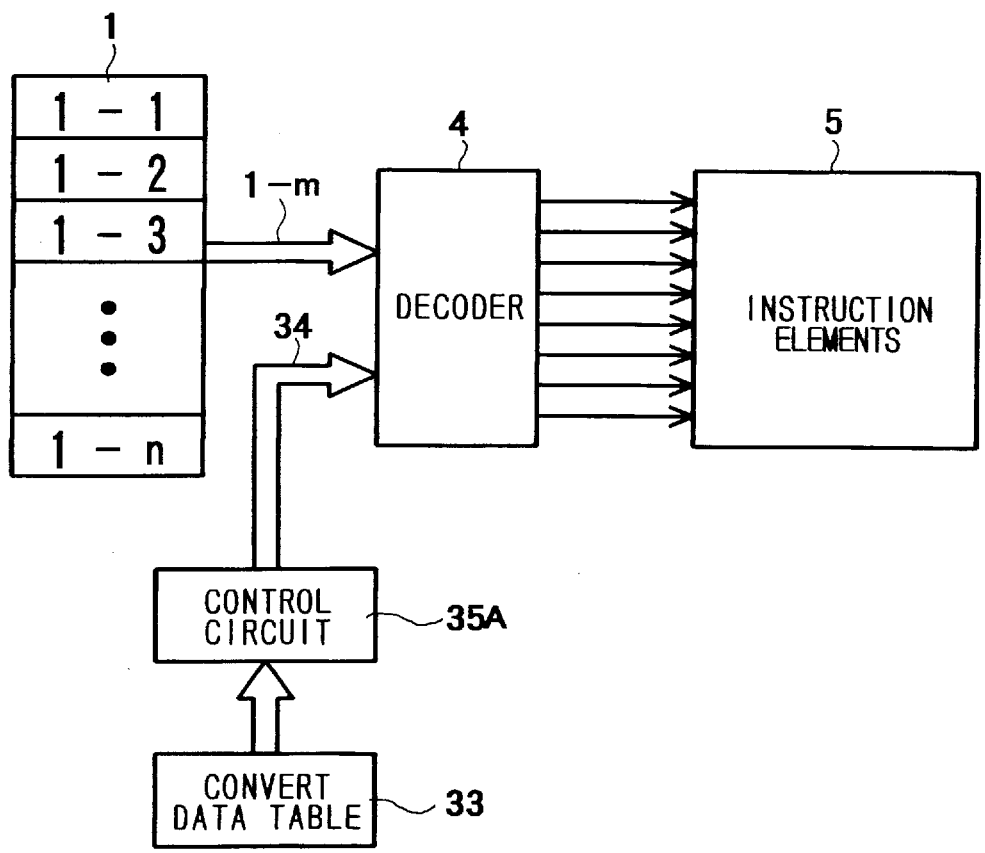
FIG. 2A is a circuit diagram showing a modification of the second embodiment of the pattern generating apparatus according to the present invention, in which a gate control circuit (or inversion circuit) 35A for connecting or disconnecting the conversion data table to and from the decoder or for outputting an inversion signal and/or a non-inversion signal is connected between the decoder 4 and one conversion data table 33, instead of the selector 35.
Figure 3:
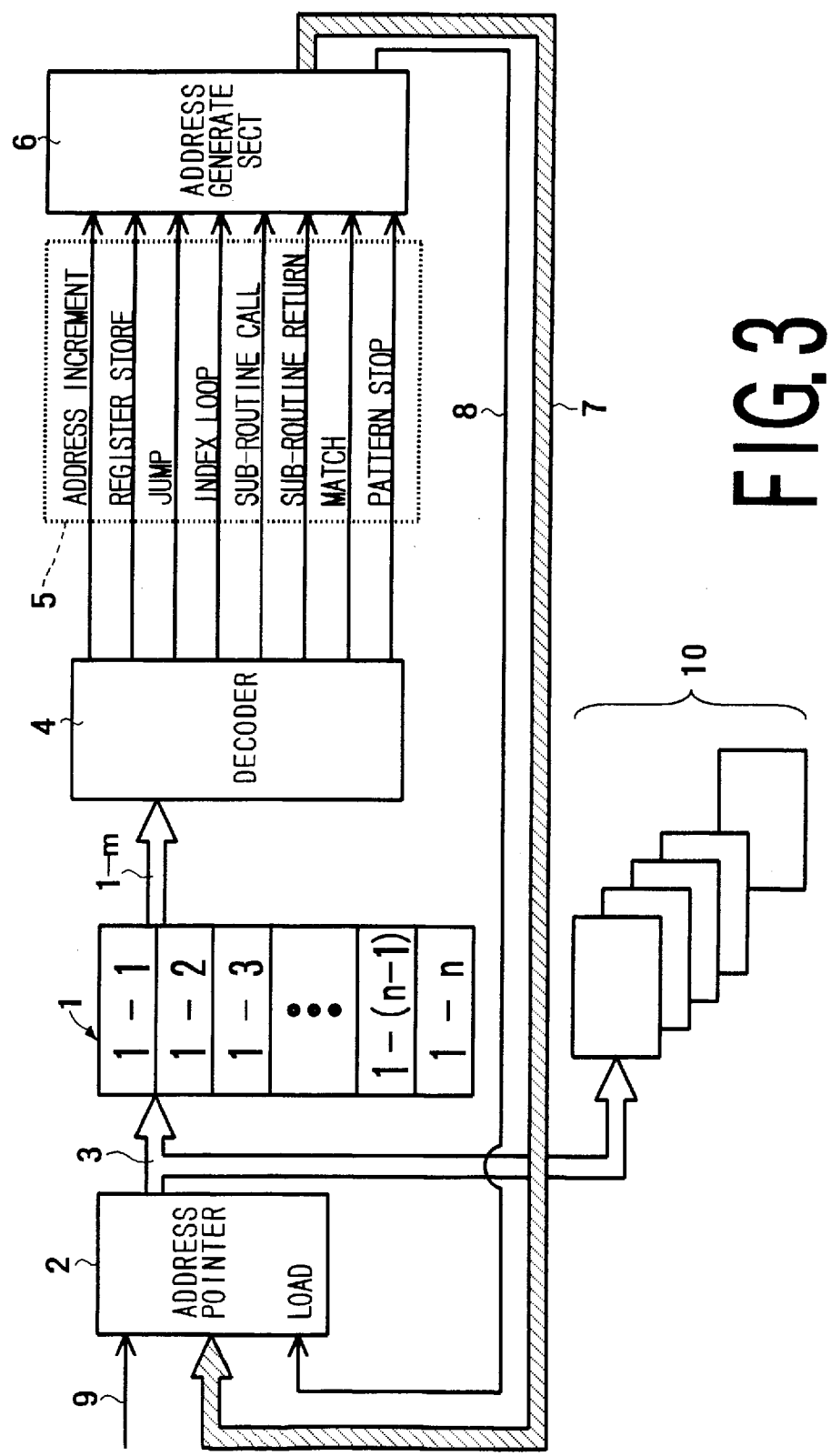
FIG. 3 is a circuit diagram showing a prior art pattern generating apparatus.

Further, instead of the selector 35, it is possible to provide a gate control circuit (or an inversion circuit) 35A in correspondence to the two tester models, as shown in FIG. 2A. In this case, the conversion data are not given to one of the two models, but the conversion data are given to the other of the two models. Or else, two conversion data of inversion relationship between both can be given to the two models, respectively.

As described above, since the pattern generating apparatus according to the present invention is constructed as described above, it is possible to eliminate the work for converting one test pattern used for one tester model into the other test pattern used for the other tester model in the semiconductor test process, so that the time and labor required for the semiconductor test can be reduced markedly.

Further, conventionally, although various test patterns different according to the tester models have been used for the same products, since the test patterns can be used in common for the testers of different models, it is possible to reduce the number of test patterns and thereby to simplify the management of the test patterns.

Further, even when the tester has a plurality of different pattern generating sections, the pattern generating apparatus of the present invention can be applied thereto by adding the minimum possible hardware elements. Further, it is possible to construct a high efficiency test system, without exerting any influence upon the test time.

What is claimed is:

1. A pattern generating apparatus for generating a test pattern by accessing a pattern memory, which comprises:

an address pointer for outputting a memory address composed of an instruction memory address and a pattern memory address for accessing the pattern memory;

an instruction memory for storing instructions and for outputting an instruction code according to the instruction memory address;

a plurality of conversion data tables each for outputting different conversion data;

a selector for selecting one of said conversion data tables, to output the conversion data of said selected conversion data table;

a decoder for decoding the instruction code applied by said instruction memory on the basis of the conversion data applied by said selector, to output one or plural instruction elements; and an address generating section responsive to one or plural instruction elements, for outputting a branch destination address corresponding to the received instruction element to said address pointer, said address pointer outputting the memory address on the basis of the outputted branch destination address.

2. The pattern generating apparatus for generating a test pattern of claim 1, wherein said address generating section outputs a pointer load instruction to said address pointer, in addition to the branch destination address.

3. A pattern generating apparatus for generating a test pattern by accessing a pattern memory, which comprises:

an address pointer for outputting a memory address composed of an instruction memory address and a pattern memory address for accessing the pattern memory;

an instruction memory for storing instructions and for outputting an instruction code according to the instruction memory address;

a conversion data table for outputting conversion data;

a control circuit for receiving the conversion data outputted by said conversion data table;

a decoder for decoding the instruction code applied by said instruction memory on the basis of the conversion data applied by said control circuit, to output one or plural instruction elements; and an address generating section responsive to one or plural instruction elements, for outputting a branch destination address corresponding to the received instruction element to said address pointer, said address pointer outputting the memory address on the basis of the outputted branch destination address.

4. The pattern generating apparatus for generating a test pattern of claim 3, wherein said control circuit switches transmission and/or non-transmission of the conversion data of said conversion data table to said decoder, said decoder decodes the instruction codes on the basis of a different mode according to the transmission or non-transmission of the conversion data.

5. The pattern generating apparatus for generating a test pattern of claim 3, wherein said control circuit transmits the conversion data of said conversion data table to said decoder without inversion and/or after inversion, and said decoder decodes the instruction codes on the basis of different mode according to the inversion and/or non-inversion conversion data.

* * * * *